United States Patent [19]
Stiegler

[11] Patent Number: 5,773,997
[45] Date of Patent: Jun. 30, 1998

[54] REFERENCE CIRCUIT FOR SENSE AMPLIFIER

[75] Inventor: Harvey J. Stiegler, Houston, Tex.

[73] Assignee: Texas Instruments Incorporated, Dallas, Tex.

[21] Appl. No.: 727,842

[22] Filed: Oct. 4, 1996

Related U.S. Application Data

[63] Continuation of Ser. No. 308,022, Sep. 16, 1994, abandoned.

[51] Int. Cl.[6] ............................... G11C 7/06; H03K 5/24
[52] U.S. Cl. ........................ 327/53; 327/530; 365/208
[58] Field of Search .................................. 327/51, 52, 53, 327/56, 530, 538, 50; 365/208, 207, 189.09, 185, 189.01, 203, 210; 330/310

[56] References Cited

U.S. PATENT DOCUMENTS

| 4,464,591 | 8/1984 | Rapp | 327/53 |
|---|---|---|---|
| 4,879,682 | 11/1989 | Engles | 327/51 |
| 5,130,580 | 7/1992 | Min et al. | 327/53 |
| 5,218,570 | 6/1993 | Pascucci et al. | 327/52 |
| 5,260,899 | 11/1993 | Yasuda et al. | 365/208 |
| 5,301,152 | 4/1994 | Iwashita | 365/208 |
| 5,371,703 | 12/1994 | Miyamoto | 365/208 |

Primary Examiner—Timothy P. Callahan
Assistant Examiner—Eunja Shin
Attorney, Agent, or Firm—Theodore D. Lindgren; Robby T. Holland; Richard L. Donaldson

[57] ABSTRACT

Reference circuitry RC includes a current-sensing translator M5–M7, MX connected to a current reference source RS. The outputs O1, O2, etc. of the current-sensing translator M5–M7, MX are mirrored into one or more sense amplifiers SA1,SA2 of sensing circuitry SC. The current-sensing translator M5–M7, MX permits the current from the current reference source RS to be mirrored to multiple sense amplifiers SA1,SA2 at a predetermined ratio.

8 Claims, 2 Drawing Sheets

REFERENCE CIRCUIT FOR SENSE AMPLIFIER

This application is a continuation of application Ser. No. 08/308,022, filed Sep. 16, 1994 now abandoned.

BACKGROUND OF THE INVENTION

The present invention relates to integrated-circuit memory arrays, including erasable programmable read-only-memory (EPROM or flash EPROM) arrays. In particular, the invention relates to reference circuitry for comparison sensing of currents during reading of such memories. The reading operation provides indication as to whether or not a particular memory cell is programmed with a "1" or a "0".

An example of prior-art reference circuitry is described in "A 29s 8 Mb EPROM with Dual Reference-Column ATD Sensing", Sweha et al., ISSCC 1991, (p. 264–265). Other prior-art circuitry is described, for example, in U.S. Pat. Nos. 4,868,790 and 4,951,257.

An EPROM cell typically comprises a floating-gate field-effect transistor. The floating-gate conductor of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate conductor of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

An EPROM array may contain millions of floating-gate memory cells arranged in rows and columns. The sources of each cell in a column are connected to a source-column line and the source-column line for a selected cell may be connected to reference potential or ground during reading of the selected cell by a sense amplifier. The drains of each cell in a column are connected to a separate bitline (drain-column line) and the drain-column line for a selected cell is connected to the input of the sense amplifier during reading of the selected cell. The control gates of each cell in a row are connected to a wordline, and the wordline for a selected cell is connected to the predetermined select voltage during reading of the selected cell.

During the read operation, the current through the selected cell is compared with a reference current to determine whether or not the selected cell is programmed with a "0" or a "1". The reference current is derived from reference circuitry, which may include one or more floating-gate cells identical to the cell being read or may include a column of such reference cells. The reference circuitry is connected to input of a reference-side current-sensing amplifier. The output of the reference-side current-sensing amplifier is connected to one side of a differential amplifier. The differential amplifier compares the voltage output of the reference-side current-sensing amplifier with the voltage output of a memory-side sensing amplifier connected to the selected memory cell being read. If the reference-circuitry comprises a memory cell that is essentially the same as the memory cell being read, it is generally necessary to unbalance the current-sensing amplifiers in order to arrive at a reference current between the current of selected cells programmed with a "0" and the current of selected cell programmed with a "1". It is preferable to use balanced sense amplifiers with balanced loads during the read mode of operation because the rise times are the same. It is also useful to use balanced sense amplifiers in the verification mode of operation to aid in the accurate determination of threshold voltage. However, the use of balanced sense amplifiers and loads requires a reference circuitry that is capable of furnishing a current different from that through a single reference cell identical to an array cell. There is a need for reference circuitry that provides that capability.

SUMMARY OF THE INVENTION

The circuitry of this invention provides a reference current derived from reference circuitry comprising one or more reference cells, thereby permitting the sense amplifiers to be balanced. An advantage of the circuitry is that it allows multiple sense amplifiers to operate with a single reference current derived from one reference circuit. In addition, that reference circuit may be switched to provide a different reference current for each of the various sensing modes, such as reading and as erase and program verification. When the reference circuit is switched, all of the sensing circuitry is changed to the new mode of operation at the same time.

The reference circuitry of this invention includes a current-sensing translator, similar to the current-sensing amplifiers in both sides of the array sense amplifiers. The input of the current-sensing translator is connected to a reference-memory-cell circuit. The output of the current-sensing translator is mirrored into one or more current-sensing amplifiers in the array sense amplifier. The current-sensing translator permits the current from the reference-memory-cell circuit to be mirrored to multiple array current-sensing amplifiers at a predetermined ratio.

DETAILED DESCRIPTION OF THE INVENTION

Figure 1:
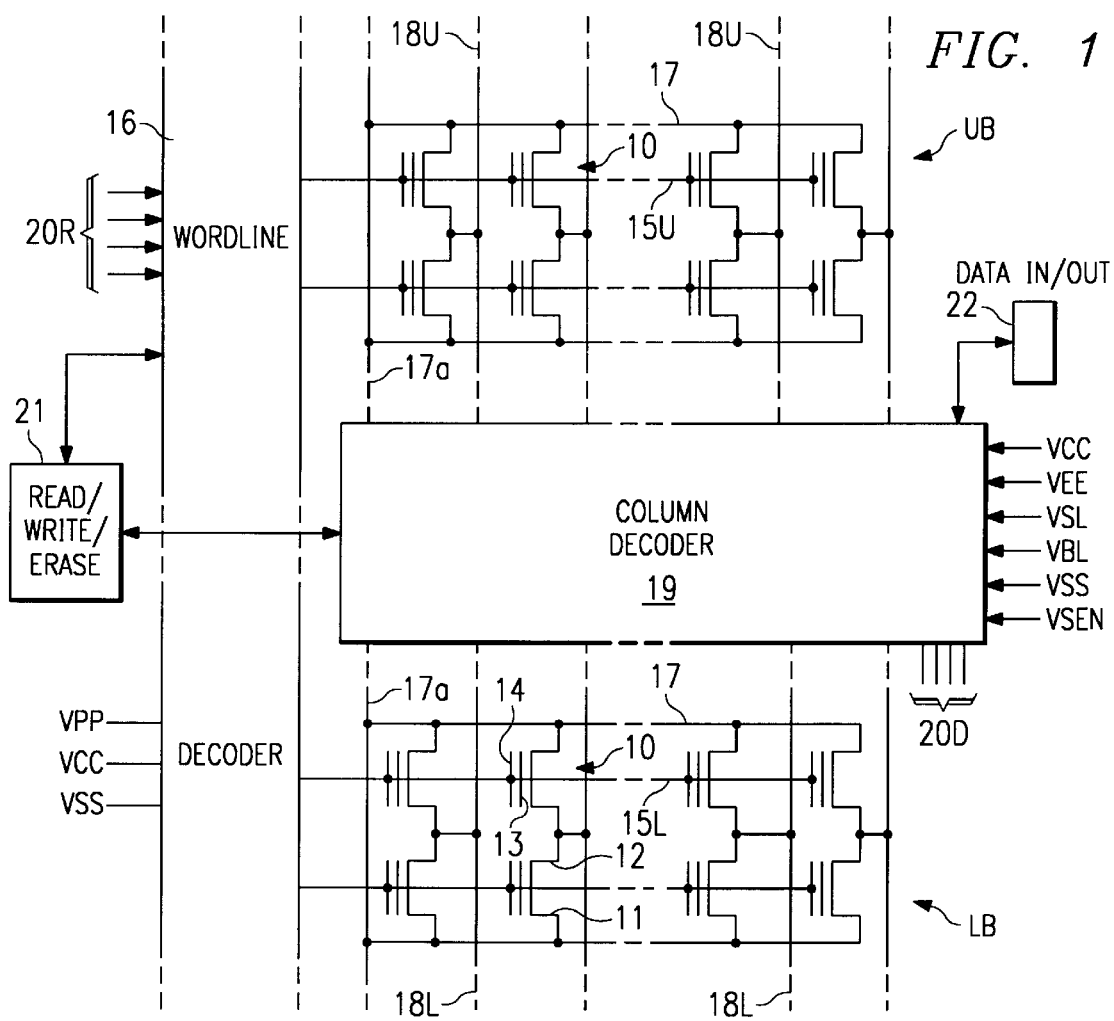
FIG. 1 is an electrical schematic diagram, in partial block form, of a flash memory.

Referring to FIG. 1, an example array of memory cells, which is an integral part of a memory chip, is shown for the purpose of illustrating use of the method and circuitry of this invention. The array is divided, for example, into an upper block UB and a lower block LB of cells 10. Each cell 10 is a floating-gate transistor having a source 11, a drain 12, a floating gate 13, a control gate 14. Each of the control gates 14 in a row of cells 10 is connected to a wordline 15U or 15L, and each of the wordlines 15U or 15L is connected to a wordline decoder 16. Each of the sources 11 in a row of cells 10 is connected to a source line 17. Each of the drains 12 in a column of cells 10 is connected to a drain-column line 18U or 18L. Each of the source lines 17 is connected by a common-column line 17a to a column decoder 19 and each of the drain-column lines 18U or 18L is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage VCC (approx. +5 V) to the selected wordline 15U or 15L, and to apply a low voltage (ground or VSS) to deselected wordlines 15U and/or 15L. The column decoder 19 functions to apply a preselected positive voltage VSEN (approx. +1 V) to at least the selected drain-column line 18U or 18L and to apply a low voltage (approximately 0 V) to the source line 17. The column decoder 19 also functions, in response to signals on address lines 20D, to connect the selected drain-column line 18U or 18L of the selected cell 10 to the DATA IN/OUT terminal 22. The conductive or nonconductive state of the cell 10 connected to the selected drain-column line 18U or 18L and the selected wordline 15U or 15L is detected by sensing circuitry that furnishes a signal to the DATA IN/OUT terminal 22. That sensing circuitry is the subject of this invention.

During a flash-erase mode, the column decoder 19 functions to leave all drain-column lines 18U and/or 18L floating (connected to a high impedance such as field-effect transistor biased in "OFF" condition). The wordline decoder 16 functions to connect all the wordlines 15U and/or 15L to VSS, which may be ground or 0 V. The column decoder 19 also functions to apply a positive voltage VEE (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15U or 15L is at reference voltage VSS, the cell 10 remains in the nonconducting state during erase.

In a write or program mode, the wordline decoder 16 may function, in response to wordline address signals on lines 20R and to signals from Read/Write/Erase control circuit 21, (or microprocessor 21) to place a preselected first programming voltage VPP (approx. +12 V) on a selected wordline 15U or 15L, including a selected control-gate 14. Column decoder 19 also functions to place a second programming voltage VBL (approx. +5 to +10 V) on a selected drain-column line 18U or 18L and, therefore, the drain 12 of selected cell 10. Source lines 17 are connected to reference potential VSS, which may be ground. All of the deselected drain-column lines 18U and/or 18L are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately -2 V to -6 V with respect to the channel region (with the control gate 14 at 0 V). For memory cells 10 fabricated in accordance with the example embodiment, the coupling coefficient between a control gate 14/wordline 15U or 15L and a floating gate 13 is approximately 0.6. Therefore, a programming voltage VPP of 12 V, for example, on a selected wordline 15U or 15L, including the selected control gate 14, places a voltage of approximately +7.2 V on the selected floating gate 13. The voltage difference between the floating gate 13 (at approx. +7.2 V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate, a state which is read as a "zero" bit. Non-programmed cells 10 have source-drain paths under the floating gate 13 that are conductive with +5 V on their control gates, and those cells 10 are read as "one" bits.

For convenience, a table of read, write and erase voltages is given in TABLE I below:

TABLE I

|  | Read | Flash Erase | Program |
|---|---|---|---|
| Selected Wordline | 5 V | 0 V (All) | +12 V |
| Deselected Wordlines | 0 V | — | 0 V |
| Selected Drain Line | 1.0 V | Float (All) | +5 V to +10 V |
| Deselected Drain Lines | 0 V/Float | — | Float |
| Source Lines | 0 V | +10 V or +15 V | 0 V |

The sensing circuitry of this invention may be, in part, located in column decoder 19 of a nonvolatile or other memory device such as that shown in FIG. 1. In response to voltages applied to specific wordlines 15U or 15L and drain column-lines 18U or 18L, the sensing circuitry transmits a signal to DATA IN/OUT terminal 22 indicating whether a particular cell is programmed with a "0" or a "1".

Prior-art EPROMs, or flash EPROMs, usually utilize a reference cell 10R, or column of reference cells 10R, connected to a reference-side current-sensing amplifier to furnish a comparison voltage to one input terminal of a differential amplifier. Because the reference cell 10R is usually fabricated at the same time and with the same dimensions as the array cells 10, cells 10R and 10 draw the same current, if the array cell 10 is erased. Therefore, the reference-side current-sensing amplifier must be unbalanced in relation to the array-side current-sensing amplifier to arrive at a comparison output voltage somewhere between the voltage related to the current through a programmed cell 10 and the voltage related to the current through an erased cell 10. That is, in general, the magnitude of the voltage derived from the reference circuitry should be about half way between the magnitude of the voltage derived from an array cell programmed with a "0" and the magnitude of the voltage derived from an array cell programmed with a "1". An exception to that general condition is that balanced loads and reference currents are sometimes used for program and/or erase verification sensing operations.

Figure 2:
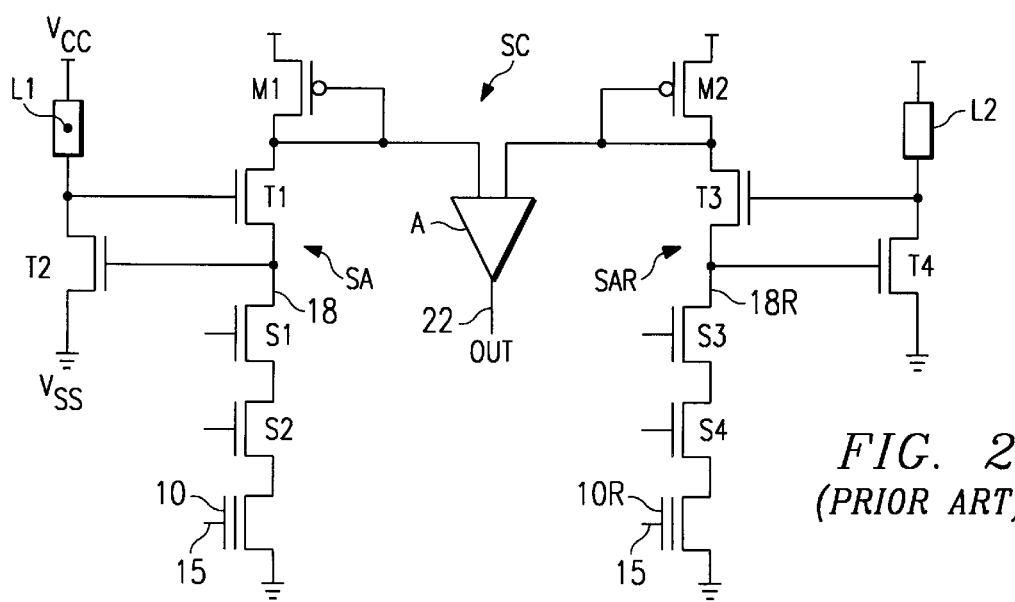
FIG. 2 illustrates a prior-art sensing circuit.

FIG. 2 illustrates a typical prior-art sensing circuit SC for a nonvolatile memory. Such circuits generally use a form of "single-ended" current-sensing of both the current through the source-drain path of an array cell 10 and the current through a single static reference cell 10R, which may be in a column of such reference cells 10R. Usually, a memory-side sense amplifier SA (M1, T1, T2, L1) is used to sense the current in the array cell 10 through column-select transistors S1 and S2. A reference-side sense amplifier SAR (M2, T3, T4, L2) is used to sense the current in a reference-current source, such as a particular reference cell 10R, through column-select transistors S3 and S4. Voltages directly related to the two currents are compared by differential amplifier A. The output of differential amplifier A indicates at terminal 22 whether or not the cell 10 being read is programmed with a "0" or a "1". Optional transistors T1–T4 and loads L1–L2 are known in the prior-art and are used to cut off current flow at low values of read current.

To achieve satisfactory operation in such prior-art sensing circuitry SC of the type shown in FIG. 2, the current sense amplifiers SAR and SR are usually unbalanced. That is transistors M1 and M2 ratio current such that the current through transistor M2 is, for example, equal to twice the current through transistor M1. The predetermined ratio (two-to-one, for example) is realized by the well-known practice of forming the respective source-drain paths of transistors M1 and M2 with proper relative length and width dimensions. For example, transistor M2 may have a channel that is the same length as that of transistor M1 but is twice the width to provide a two-to-one ratio of current between transistors M2 and M1. If the source-drain dimensions of transistors M1 and M2 are the same, another method must be used to cause the current and/or voltage associated with the reference-current source to differ from the current and/or voltage associated with the array cell 10 to ensure the integrity of the read-operation data.

Many variations of the circuit of FIG. 2 are used. An improvement over the circuit of FIG. 2 is described in U.S. Pat. No. 5,528,543 issued Jun. 18, 1996 to Harvey J. Stiegler and assigned to Texas Instruments Incorporated, which is hereby incorporated by reference. The circuit described in that patent, entitled SENSE AMPLIFIER CIRCUITRY, is shown in FIG. 3.

Figure 3:
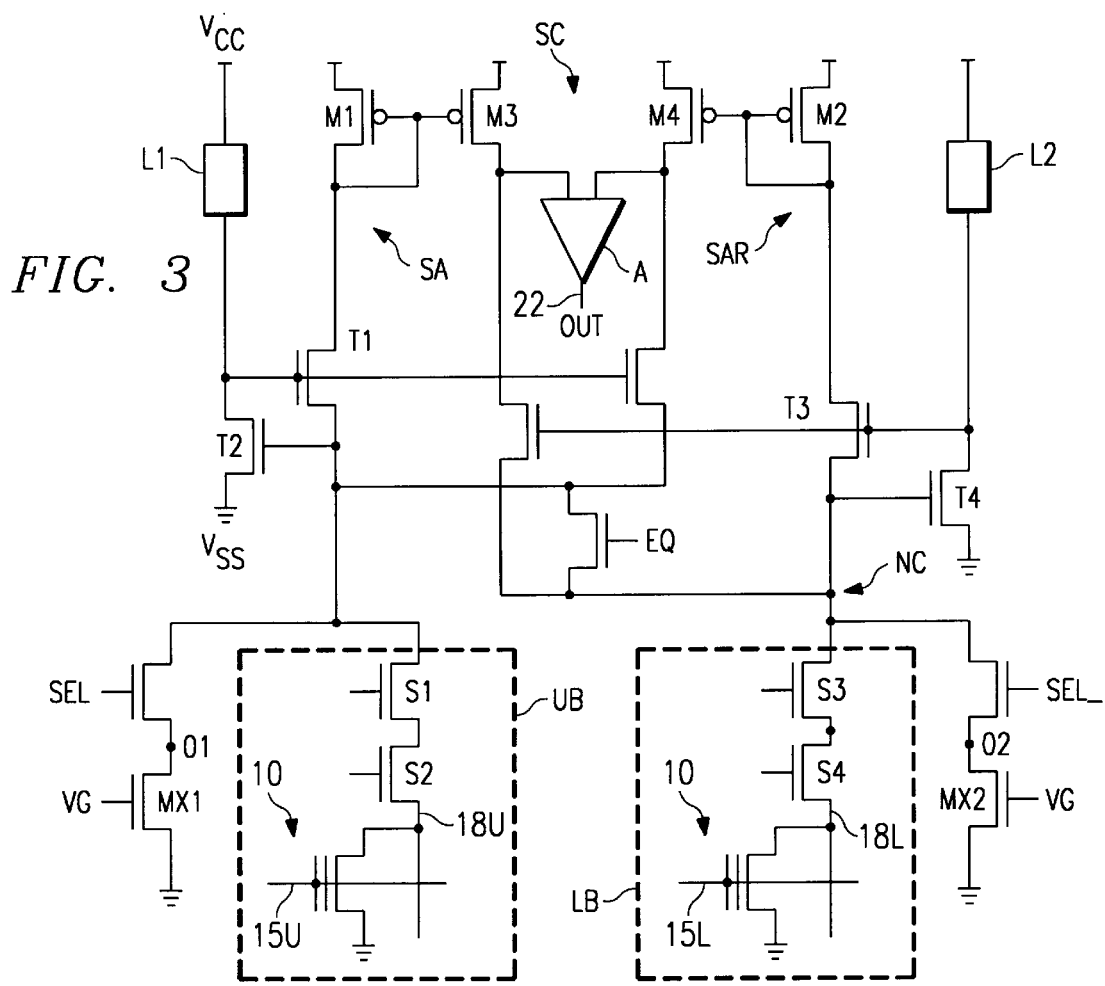
FIG. 3 illustrates a functional arrangement of a balanced sensing circuit for use with the reference-current source of this invention.

In one mode of operation of the circuit of FIG. 3, the first sense amplifier SA1 (M1, M3, T1, T2, L1) is used to sense the current in a cell 10 in, for example, an upper block UB of the array through column-select transistors S1 and S2. The second sense amplifier SA2 (M2, M4, T3, T4, L2) is used to sense the current in the reference circuitry such as that of FIG. 4 through transistor T6 activated by signal SEL__. The second sense amplifier SA2 also senses through activation of column-select transistors S3 and S4 capacitance-charging current in, for example, a lower block LB of the array identical to the upper block UB. The wordlines 15L in the lower block LB of the array are biased to prevent conduction through any of the cells 10 in that lower block LB. Voltages directly related to the two currents are compared by differential amplifier A.

In a second mode of operation, the current through a cell 10 in lower block LB is compared with the current from reference circuitry 1ORU and transistor T7, which is activated by signal SEL. Operation is identical to that described above.

The first sense amplifier of FIG. 3 includes a pair of P-conductivity-type current-mirror transistors M1 and M3 in which field-effect transistor M3 mirrors the current through load mirror transistor M1. Current-mirror transistors M1 and M3 each have a commonly-connected source-drain electrodes and have gates connected to each other. The commonly-connected source-drain electrodes of transistors M1 and M3 are connected to supply-voltage source VCC. The second sense amplifier includes identical circuitry.

For most effective sensing, the circuit of FIG. 3 includes balanced mirror circuits (i.e., M1=M2 and M3=M4). This means that, in order to sense an erased cell 10 on drain-column line 18U, a reference-current source is needed on the lower drain-column line 18L that conducts approximately one-half as much current as an erased cell 10. Ideally, this reference-current source is connected to the lower drain-column line 18L at node NA (for sensing data in the upper block of the array), but the reference-current source may be connected to node NB or node NC with little compromise in performance. With this method, data is sensed very quickly after the signal at terminal EQ goes low, provided the voltages on the selected wordlines 15 and selected column-line 18 have reached a final transient value.

Figure 4:
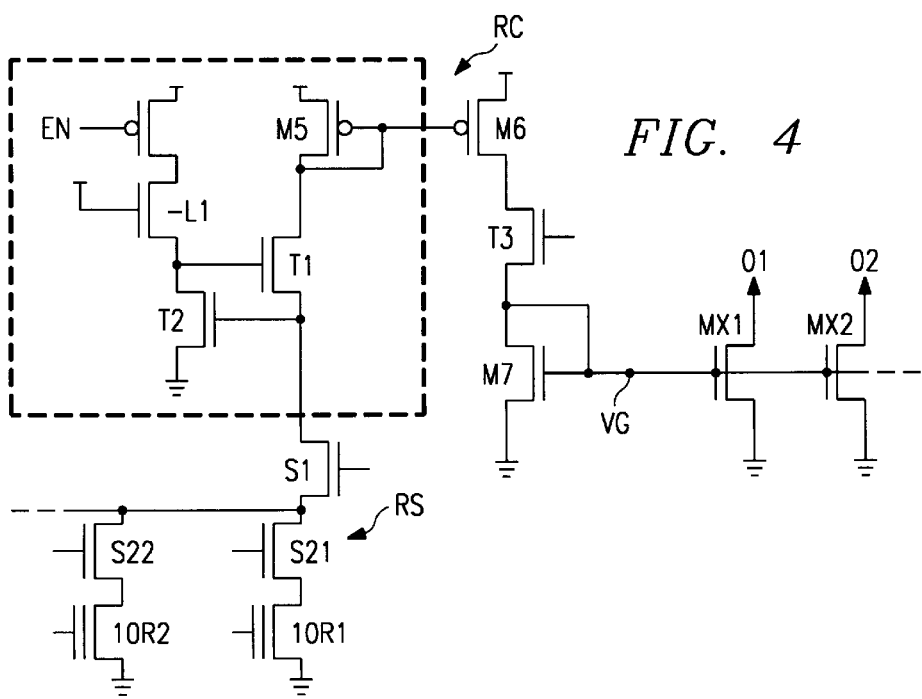
FIG. 4 illustrates an exemplary reference-current source of this invention.

The circuit of FIG. 4 illustrates reference circuitry RC that may be used, for example, with the circuit of FIG. 3 to furnish, for example, one-half of the current through an array cell 10 with an uncharged floating gate 13. The subcircuit within the dashed lines essentially mimics the sense amplifier with which the reference circuitry RC is used, such as the sense amplifier of FIG. 3. That subcircuit may, of course, have other configurations, depending on the actual sense amplifier used.

In the circuit of FIG. 4, multiple reference cells 10R1, 10R2, etc. of example reference source RS are switched in and out by select gates S21, S22, etc., which represent the one array select gate S2 shown in FIG. 3. Those multiple reference cells 10R1, 10R2, etc. are used, if desired, to change the characteristics of the sensing in different modes (e.g., read, program verify, erase verify, etc.). That is, reference cells 10R1, 10R2, etc., may be adjusted separately to various threshold voltages and may be fed by various gate voltage supplies. The current drawn by the reference cells 10R1, 10R2, etc., is transferred by a pair of current mirrors (M5 and M6; M7 and MX1, etc.) to the reference-side sense amplifier SAR. The overall current ratio R between that transferred to sense amplifier SAR and that flowing in reference cells 10R1, 10R2, etc. is given by the following equation:

$$R = \frac{(W/L)_{MX}}{(W/L)_{M7}} \times \frac{(W/L)_{M6}}{(W/L)_{M5}}$$

In the foregoing equation, W represents channel width and L represent channel length.

For example, if two reference cells 10R1 and 10R2, both with uncharged floating gates 13, are connected in parallel, the current flowing through the parallel combination will be twice that of an array cell 10 that has an uncharged floating gate. Therefore, assuming that all channel lengths L are the same, to reach the desired half-current value, the width W of mirror transistor MX may be one-half the width W of mirror transistor M7 and the width W of mirror transistor M6 may be one-half the width W of mirror transistor M5.

Optional transistor T3 mimics the corresponding transistor T1 in the subcircuit enclosed by dashed lines. Depending upon the characteristics of M6 and M7, transistor T3 may not be required. The sizes of the transistors are adjustable to reduce the impedance of the drive on node VG to improve noise immunity, but the overall ratio R is maintained as required.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. Reference circuitry for providing a reference signal to either of two inputs of multiple differential amplifiers, said reference circuitry comprising:

at least one reference memory cell in a circuit configured to provide a reference current;

a first mirror circuit having an input and an output, said input of said first mirror circuit coupled to said reference current; and a second mirror circuit having an input and an output, said input of said second mirror circuit coupled to said output of said first mirror circuit, and said output of said second mirror circuit coupled to a switching means for switchably coupling said output of said second mirror circuit to either of said inputs of at least one of said multiple differential amplifiers.

2. The reference circuitry of claim 1, wherein at least one of said first and second mirror circuits comprises first and second transistors, each said transistor having a channel with a width-to-length ratio, and wherein the width-to-length ratio of said first transistor differs from the width-to-length ratio of said second transistor.

3. The reference circuitry of claim 1, said at least one reference memory cell further including a source-drain path, and said circuit further including a second reference memory cell having a source-drain path; wherein the source-drain path of said second reference memory cell is connected in parallel with the source-drain path of said at least one reference memory cell.

4. A method for providing a reference input to either of two inputs of one of multiple differential amplifiers, said method comprising:

coupling a reference current from a configured reference circuit having at least one reference memory cell to an input of a first mirror circuit; and coupling an output of said first mirror circuit to an input of a second mirror circuit;

by switching, coupling an output of said second mirror circuit to either of said two inputs of one of said multiple differential amplifiers.

5. The method of claim 4, wherein at least one of said first and second mirror circuits comprises first and second transistors, each said transistor having a channel with a width-to-length ratio, and wherein the width-to-length ratio of said first transistor differs from the width-to-length ratio of said second transistor.

6. The method of claim 4, said at least one reference memory cell further including a source-drain path, and said reference circuit further including a second reference memory cell having a source-drain path; wherein the source-drain path of said second reference memory cell is connected in parallel with the source-drain path of said at least one reference memory cell.

7. Reference circuitry for providing a reference signal to either of two inputs of multiple differential amplifiers, said reference circuitry comprising:

reference memory cell means configured to provide a reference current;

first mirror means having an input and an output, said input of said first mirror means coupled to said reference-cell means; and second mirror means having an input and an output, said input of said second mirror means coupled to said output of said first mirror means, said output of said second mirror means coupled to a switching means for switchably coupling said output of said second mirror means to either of said inputs of said multiple differential amplifiers.

8. The reference circuitry of claim 7, wherein at least one of said first and second mirror means further include means for forming a predetermined output-to-input current ratio.

* * * * *